United States Patent [19]

Dupuis et al.

[11] Patent Number: 4,829,476

[45] Date of Patent: May 9, 1989

[54] DIFFERENTIAL MAGNETORESISTIVE MEMORY SENSING

[75] Inventors: Timmothy J. Dupuis, Minneapolis; James D. Reinke, New Hope; William J. Linder, Minneapolis, all of Minn.

[73] Assignee: Honeywell Inc., Minneapolis, Minn.

[21] Appl. No.: 78,612

[22] Filed: Jul. 28, 1987

[51] Int. Cl.$^4$ ............................................. G11C 11/00
[52] U.S. Cl. ....................................... 365/158; 365/87; 365/8
[58] Field of Search ...................... 365/8, 87, 158, 173, 365/203, 209, 213; 307/530; 360/113

[56] References Cited

U.S. PATENT DOCUMENTS

| | | | |
|---|---|---|---|
| 3,218,616 | 11/1965 | Huijer et al. | 365/158 |
| 3,432,832 | 3/1969 | Holtwijk | 365/158 |
| 3,493,943 | 2/1970 | Raffel | 365/158 X |
| 3,531,780 | 9/1970 | Huijer | 365/158 |
| 3,883,858 | 5/1975 | Lienhard et al. | 365/87 |
| 3,996,575 | 12/1976 | Battarel | 365/158 X |
| 4,174,539 | 11/1979 | Timm | 365/8 |
| 4,208,725 | 6/1980 | Paul et al. | 365/87 |
| 4,287,576 | 9/1981 | Pricer | 365/203 |
| 4,318,186 | 3/1982 | Wynn | 365/8 |
| 4,356,523 | 10/1982 | Yeh | 360/113 |
| 4,388,699 | 6/1983 | Balakrishnan | 365/8 |
| 4,455,626 | 6/1984 | Lutes | 365/158 |
| 4,485,319 | 11/1984 | Davies et al. | 307/530 |
| 4,514,828 | 4/1985 | Closson et al. | 365/8 |
| 4,538,242 | 8/1985 | Toyooka et al. | 365/8 |
| 4,567,387 | 1/1986 | Wacyk | 307/530 |
| 4,722,073 | 1/1988 | Lampe et al. | 365/87 |

OTHER PUBLICATIONS

"Magnetoresistance in Laminated NiFe Films," J. A. C. vanOoyen et al., *Journal of Applied Physics*, vol., 53, No. 3, 3/82, pp. 2596–1598.

"Magnetoresistive Switching of Small Permalloy Sandwich Structures," J-L. Berchier et al., *Journal of Applied Physics*, vol. 55, No. 2, 1/15/84, pp. 487–492.

"Magnetoresistive Readout for 200-Nsec TF Memory," *Electronic Design*, Mar. 15, 1962.

"Magnetoresistive Readout of Thin-Film Memories," P. Huijer, *Digest of Technical Papers*, International Solid-State Circuits Conference, 1962.

*Primary Examiner*—Joseph A. Popek
*Attorney, Agent, or Firm*—Kinney & Lange

[57] ABSTRACT

A sensing circuit for sensing magnetic states of magnetic bit structures through selectively providing current through and across selected ones of such bit structures while selectively sensing and comparing voltage drops thereacross.

23 Claims, 3 Drawing Sheets

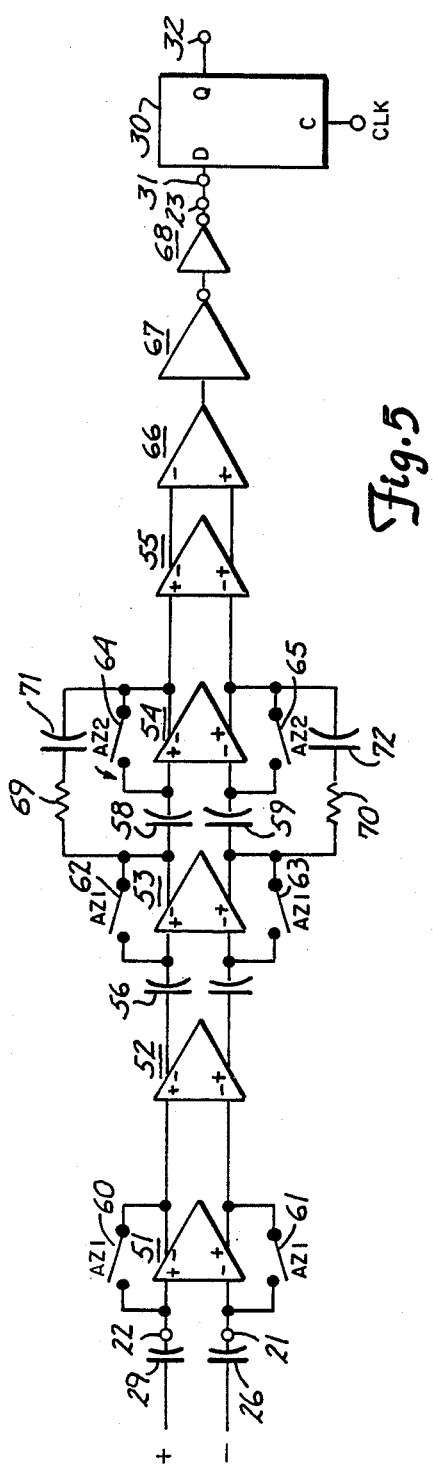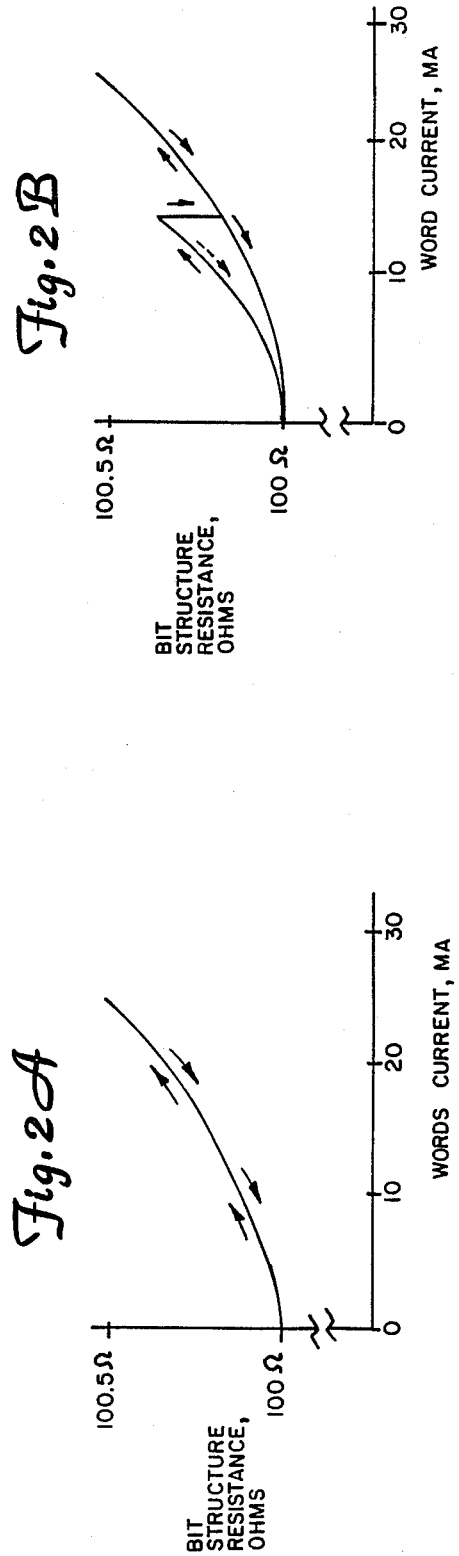

DIFFERENTIAL MAGNETORESISTIVE MEMORY SENSING

REFERENCE TO CO-PENDING APPLICATIONS

Reference is hereby made to earlier filed copending applications by J. M. Daughton and A. V. Pohm entitled "MAGNETIC" having Ser. No. 870,068, and by J. M. Daughton and J. S. T. Huang entitled "MAGNETIC MEMORY, CONFIGURATION" having Ser. No. 879,679, now U.S. Pat. No. 4,731,757. These copending applications have been assigned to the same assignee as the present application

BACKGROUND OF THE INVENTION

Field of the Invention.

The present invention relates to ferromagnetic thin film memories and, more particularly, to ferromagnetic thin film memories in which states of the memory cells based on magnetization direction are determined through magnetoresistive properties of the thin film sensed by an electronic circuit Digital memories of various kinds are used extensively in computers and computer system components, in digital processing systems, and the like. Such memories can be formed, to considerable advantage, based on the storage of digital bits as alternative states of magnetization in magnetic materials in each memory cell, typically thin film materials. These films may be ferromagnetic thin films having information stored therein through the direction of the magnetization occurring in that film, this information being obtained through either inductive sensing to determine the magnetization state, or by magnetoresistive sensing of such states Such ferromagnetic thin film memories may be conveniently provided on the surface of a monolithic integrated circuit to provide easy electrical interconnection between the memory cells and the memory operating circuitry.

Ferromagnetic thin film memory cells can be made very small and packed very, closely together to achieve a significant density of stored digital bits, properties which permit them to be provided on the surface of a monolithic integrated circuit as indicated above. Suitable constructions are indicated in the above indicated references. One of those constructions, as an example, is shown in FIG. 1 where a bit structure, 10, for a memory cell is presented formed over a semiconductor material body, 12, as used in a monolithic integrated circuit, and directly on an insulating layer, 13, itself supported on a major surface of body 12 in the integrated circuit. Only a small portion of the integrated circuit is shown, and then only a small portion of the semiconductor body is shown in that integrated circuit portion.

These bit structures in an assemblage in a memory are usually provided in a series string of such bit structures, there being a plurality of such strings. In order to make interconnections between members of such a string, or between the string and the external circuitry in the integrated circuit for operating the memory, terminal regions or junctures, 14, are provided at each end of the bit structure for interconnection purposes. These interconnections might be formed of copper alloyed in aluminum.

The remainder of the bit structure disposed on the exposed major surface of insulating layer 13 is comprised of a lower ferromagnetic thin film, 15, and an upper ferromagnetic thin film, 16. Ferromagnetic thin film layers 15 and 16 exhibit uniaxial anisotropy, magnetoresistance, little magnetostriction, and are of an alloy composition typically comprising nickel, cobalt and iron.

Between ferromagnetic thin film layers 15 and 16 is a further thin layer, 17, which usually would not exhibit ferromagnetism but may be either an electrical conductor or an electrical insulator. Layer 17 must, however, in this construction, prevent the exchange interaction between electron spins on neighboring atoms from coupling across between layers 15 and 16 to lock together the magnetization vectors of each. A typical choice for layer 17 would be silicon nitride. An insulating layer, 18, covers bit structure 10 although only a part of it is shown in FIG. 1. This "sandwich" structure is used to reduce magnetic fields outside of bit structure 10.

Finally, a word line, 19, is shown in FIG. 1 disposed on the major surface of insulating layer 18. Word line 19 typically comprises an aluminum layer alloyed with copper on a titanium-tungsten base layer. A protective and insulating layer over the entire structure of FIG. 1 would be used in practice but is not shown here.

Bit structure 10 can be operated in a longitudinal mode having its easy axis extend between internal interconnections 14 perpendicular to the direction of word line 19, or in a transverse mode having its easy axis of magnetization parallel with the direction of word line 19. In either situation, information, kept as a digital bit having one of two alternative logic values in bit structure 10, is stored therein in layers 15 and 16 by having the magnetization vector point in one direction or the other, generally along the easy axis of magnetization. If the direction of magnetization is caused to rotate from such a direction by external magnetic fields, the electrical resistance of layers 15 and 16 changes with this magnetization direction rotation because of the magnetoresistive properties of such layers. For the kinds of materials typically used in layers 15 and 16, the maximum change in resistance is on the order of a few percent at most of the minimum resistance value.

Sense current refers to the current flow through bit structure 10 from one terminal 14 to the other terminal 14 thereof, and word current refers to current flowing in word line 19 adjacent to, and transverse to the orientation of, bit structure 10. Bit structure 10 can be placed in one of the two possible magnetization states through the selective application of sense and word currents, i.e. information can be "written" in bit structure 10. A bit structure 10 of a typical configuration can be placed in a "0" magnetization state by the application of a sense current in one direction therethrough, of typically 2.0 mA to 3.5 mA, and coincidentally with provision of a word current from 10.0 mA to 30.0 mA. The opposite magnetization state representing a "1" logic value can be provided through providing the same word current and a sense current of the same magnitude in the opposite direction through bit structure 10. Such states will occur very quickly after the proper current levels are reached, such state changes occurring in less than about 10 ns.

Determining which magnetization state occurs in bit structure 10, i.e. reading the information stored in bit structure 10, is done by providing externally caused magnetic fields in that bit structure, through providing coincident sense and word currents, to rotate the magnetization of the structure. As indicated above, differences occur in the electrical resistance encountered between terminal regions 14 in bit structure 10 for different magnetization directions in the structure, including changing from one easy axis direction magnetization state to the opposite direction state. As a result, there will be differences in the voltage developed across magnetic bit structure 10 by the sense current flowing therethrough depending on the magnetization direction in this structure, and so depending on which magnetization state is present in bit structure 10.

Thus, to read information in a bit structure 10, a sense current through this structure is provided in the same direction as it was provided when a "0" magnetization state was set therein. A word current in the direction used in writing either a "0" or a "1" is again applied in that direction. This word current can be of a significantly smaller magnitude than used during writing if the information in the bit structure is not to be destroyed or lost during readout. However, this will lead to operating with a smaller resistance difference between "0" and "1" magnetization states and so a smaller output signal. A word current in the writing range of from 10.0 mA to 30.0 mA will lead to either a continued "0" state or an initial "1" state becoming thereafter a "0" state, but will provide the maximum resistance difference between states and so the largest output signal.

Thus, referring to the example of FIG. 2A, a bit structure 10 in the "0" magnetization state exhibits the resistance versus applied word current characteristic shown there for a sense current present of from 2.0 mA to 3.5 mA. The characteristic can be seen to have a generally positive slope. FIG. 2B shows the resistance characteristic of the same bit structure 10, in the same circumstances, but which has, instead, a "1" magnetization state written therein. In this latter situation, bit structure 10 exhibits a higher resistance versus word current at lower word currents, up to a breakpoint, which is indicated by the more positively sloped resistance characteristic. At the breakpoint, the "1" magnetization state is written to a "0" magnetization state just as in the writing of states described above. This causes the resistance characteristic to revert to essentially that shown in FIG. 2A.

Thus, if the word current is allowed to be sufficient to change a "1" state to a "0" state, the readout process will be a destructive one leading to the loss of information which would have to be replaced in a subsequent refresh writing operation. On the other hand, as can be seen from FIG. 2B, the maximum resistance change occurs at the breakpoint giving the peak voltage change across bit structure 10 at that point. This is the maximum signal voltage available for indicating the presence of a "1" state. The application of word currents less than that at the breakpoint in FIG. 2B will still provide a voltage change across bit structure 10, but of a magnitude less than the peak signal available. Such a nondestructive readout eliminates the need for a later refresh operation.

The arrows shown along the resistance characteristics in FIGS. 2A and 2B are those showing the resistance change locus which will occur in providing a word current pulse going from 10.0 mA to 30.0 mA and back to 10.0 mA. FIG. 2B also shows a dashed line arrow indicating the abbreviated resistance change locus which is followed for word line current less than those occurring at the breakpoint in FIG. 2B. Note that the change in resistance values are measured in tenths of ohms out of a hundred ohms or so. A 0.3 Ω change with a sense current of 3.5 mA means that the voltage change peak is only on the order of 1.0 mV over a nominal bit structure voltage of 0.3 Volts.

Thus, an electronic sensing circuit is desired which can sense this small signal. This sensing must occur in the face of differences occurring in bit structures 10 from structure to structure since such structures cannot be made absolutely identical although they can be made very similar to one another.

SUMMARY OF THE INVENTION

The present invention provides a state sensing circuit for sensing magnetic states of magnetic bit structures through selectively providing current through and across selected ones of such bit structures while selectively sensing the voltage drop thereacross. Such voltage drops are compared to a reference voltage drop to determine the information represented by the signal developed. Such initial offsets can be cancelled to enhance the sensing.

BRIEF DESCRIPTION OF THE DRAWINGS

FIGS. 2A and 2B show resistance characteristics of the structure of FIG. 1,

FIG. 5 a schematic circuit and system diagram of a portion of FIG. 3, and

DETAILED DESCRIPTION OF THE PREFERRED EMBODIMENTS

Figure 1:
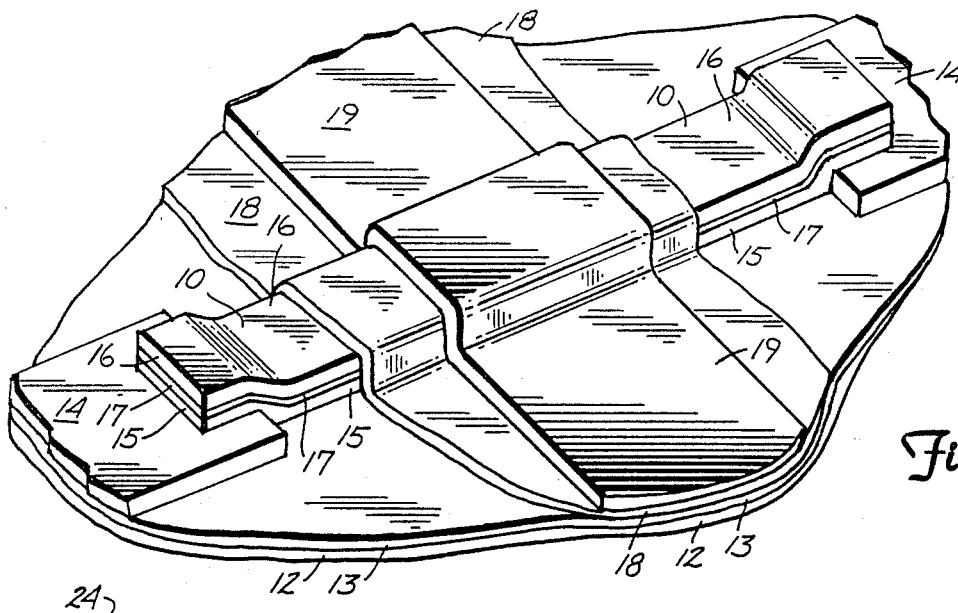
FIG. 1 shows a memory cell structure for use with the present invention.

The very small magnetization orientation change signal available from a bit structure 10, as indicated above, occurs as an increment to a much larger voltage and is best sensed in a differential arrangement with a reference voltage. This arrangement, in effect, more or less subtracts out that large underlying voltage leaving just the increment. However, differences between the various bit structures in which information is stored leads to the underlying voltage occurring across bit structure 10 due to the sense current therethrough to differ from one bit structure 10 to another. Therefore, choosing a reference value for use in the differential sensing system to be subtracted from the voltage across a bit structure 10 in which the information to be retrieved is stored would be difficult if a single constant value is to be chosen. In addition, conditions such as temperature, bit position in the array, and others will vary also from one bit structure 10 to another leading to further differences in the underlying voltage occurring across each.

These variations can be reduced to some extent if the subtracting value is obtained through use of a bit structure 10 as a reference structure having a nearly identical sense current flowing therethrough as that bit structure 10 from which information is to be retrieved. Such a reference bit structure could be formed as a separate, isolated bit structure which would be used as the reference standard for every reading operation of the memory. Such an arrangement, however, has the drawback in that the repeated use of a single reference bit can lead to heating that reference bit structure to a different temperature than would be experienced by any of the information bit structures from which information is to be retrieved in a differential reading operation. Such a result could lead to a gradual increase of offset differences between the underlying voltage across each such bit structure due to the sense current passing therethrough. That is, the resistance of the reference bit structure would increase because of its being heated to a greater temperature than the various information bit structures and so would lead to an increasing voltage drop across the reference bit structure which would appear as a greater offset to the sensing circuitry.

Such a problem could be overcome by constructing bit structures which have temperature coefficients of the value very near to zero, or by changing the current pulse rates through the bit structures either by slowing them substantially to allow temperature changes to dissipate or operating them so rapidly that there is no tendency to produce sufficient heat to cause a temperature increase. Certain structural changes such as better heat sinking would also be possible to aid in maintaining a steady temperature performance by the reference bit structure.

Should such measures be considered undesirable, and in many instances they will be, a further possibility would be to provide a plurality of reference bit structures and switch to the use of a different one for each reading operation. This would reduce the number of sense current pulses occurring in any one of the reference bit structures. This arrangement could be formed by providing an isolated plurality of reference bit structures each of which can selectively be switched into the differential sensing circuit for a reading operation.

Another alternative would be to use another bit structure in the array of information bit structures other than the one from which information in a particular reading operation is to be currently retrieved. That is, a sense current could be established through such a further bit structure to provide an underlying voltage reference value. This value would then be subtracted in a reading operation by the differential sensing circuit from the voltage occurring across the information bit structure from which information is to be retrieved. Since each reading operation would be typically for an information bit structure differing from the last one, and since a different information bit structure for use as a reference bit structure could be chosen for each reading operation, there would be little or no significant heating or other effects arising from repeated reading operations.

As stated above, each of bit structures 10 can be made having extremely small dimensions and therefore can be provided in an array of a very high density. This can happen to such an extent that a further alternative for a reference bit arrangement is to provide two substantially identical arrays of bit structures so that each bit structure in the information storage array would have a counterpart bit structure in the reference array. There is a further gain in such an arrangement in that each of the arrays could be made both an information and a reference array by storing bits of information as one of two magnetization states in each bit structure in one array, and always storing the opposite state in the counterpart bit structure in the other array.

The provision of a word current over each member of any pair of these bit structures coincidentally with sense currents therethrough will then lead to whichever member has the "1" state therein providing an output signal for reading operations of the nature described above. Defining one set of opposite states to be a "1" stored information situation, and the other opposite set of states as storing a "0", the output signal from the differential sensing arrangement will be either approximately a positive 1.0 mV for one stored information state or a negative 1.0 mV for the other stored state. Thus, the output signals will have twice the voltage range, from a positive 1.0 mV and to a negative 1.0 mV, than would be obtained from using a single bit structure to store alternative information states. The output from such a single structure would be a positive or negative 1.0 mV in one state, and zero mV's in the other.

Figure 3:
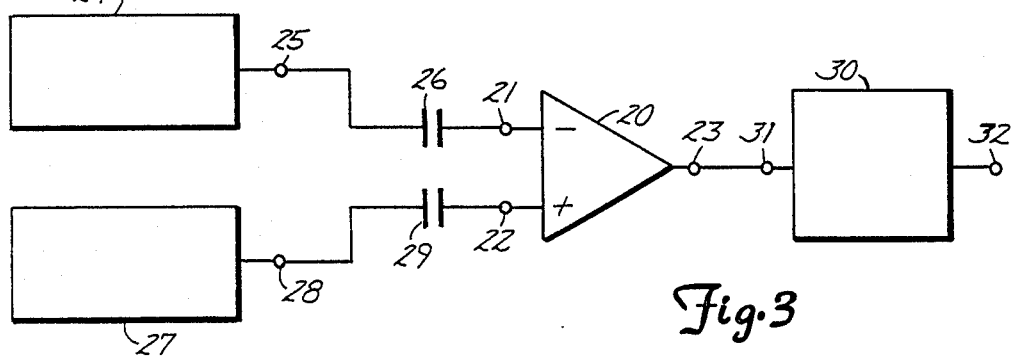
FIG. 3 shows a system diagram including the present invention.

FIG. 3 shows a magnetoresistive memory system block diagram emphasizing the portions used in connection with reading operations for retrieving information stored in the memory. A differential sensing amplifier, 20, is shown having an inverting input, 21, a non-inverting, input 22, and an output, 23. An information array, 24, of bit structures 10 has been arbitrarily connected at its information output, 25, through a capacitor, 26, to inverting input 21 of sensing amplifier 20. Similarly, a reference array, 27, of one or more bit structures 10 is connected at its output, 28, through a capacitor, 29, to non-inverting input 22 of sensing amplifier 20. Arrays 24 and 27 could be interchanged in their connections to the inputs of sensing amplifier 20. A data bit latching arrangement, 30, is connected at its input, 31, to output 23 of sensing amplifier 20. Latch arrangement 30 provides a data bit at its output, 32, at the end of each reading operation.

In a reading operation, an address of an information bit is supplied to arrays 24 and 27 (perhaps not to array 27 in those designs where there is only one bit or a few bits to be used as reference bit structures). This address is decoded to provide the proper actions in the arrays with respect to the bit structure which is to have the information therein retrieved. Such actions will include switching arrangments to provide both sense and word currents at the proper times, and with the amplitudes and in the order required. A further switching will be provided to connect the information bit structure voltage to output 25 and the reference bit structure voltage to output 28 of array 27.

These voltages switched to array outputs 25 and 28 will then be coupled through capacitors 26 and 29, respectively, to inputs 21 and 22, respectively, of differential sensing amplifier 20. Differential amplifier 20 will, in effect, subtract the one voltage from the other, amplify the difference, and provide the result at output 23 thereof. If the result at output 23 of amplifier 20, representing either a "0" or "1" information state, is a voltage which exceeds the threshold of latch arrangement 30, as it will for one of these states, latch arrangement 30 will provide the appropriate state at its output 32. If the other information state is represented by the voltage at output 23 of amplifier 20, that voltage will not exceed the switching threshold of latch arrangement 30, and the appropriate state will again be provided at output 32 of latch arrangement 30.

Figure 4:
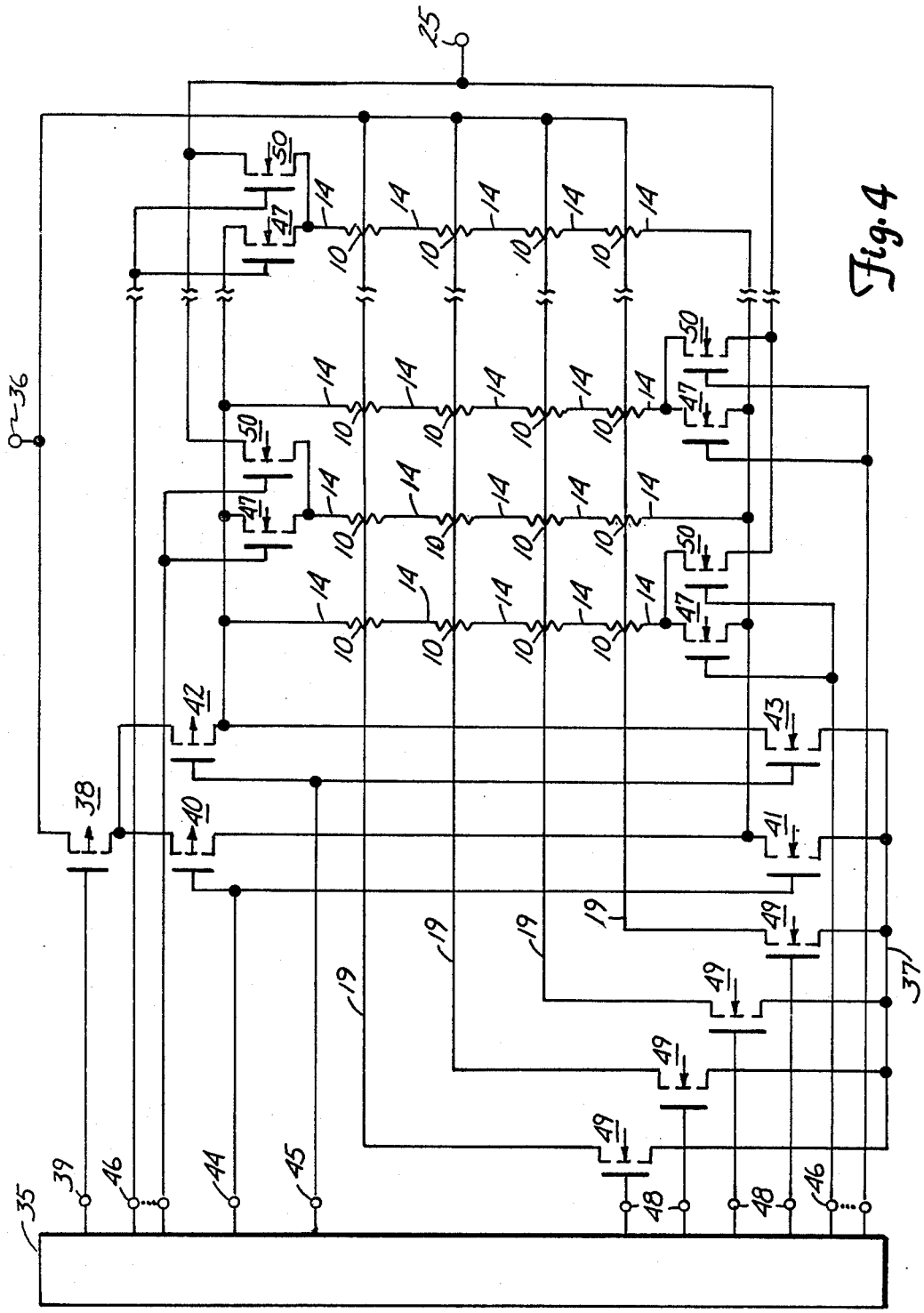
FIG. 4 shows a schematic circuit diagram of a portion of FIG. 3.

An example of the contents of either of arrays 24 or 27 is shown in FIG. 4. This is the arrangement for the last above indicated reference bit structure arrangement in which an entire memory array is provided for reference purposes replicating that array provided for information storage, or the mixing of the two functions as explained above. This is presented as the most complete approach to a reference bit structure array, and one which includes the other arrangements indicated above. However, as previously indicated, a single reference bit structure or a reference arrangement with several bit structures are also possibilities for array 27. In addition, as also indicated previously, array 27 could be dispensed with altogether and a second output provided for array 24 to which input 22 of amplifier 20 would be connected through capacitor 29. This second output on array 24 would be connected by a switch to whichever bit structures in the array 24 were chosen to serve for a particular reading operation as the reference bit structure (there could be bit structures provided in the array serving solely this purpose).

FIG. 4 is a schematic circuit diagram for a magnetoresistive memory array showing the array of bit structures 10, in part, and portions of the associated switching circuitry. Repeated portions of each are omitted, as shown by the breaks in the circuit towards the right in FIG. 4. Bit structures 10 are arranged with four of them in series with one another to form a series string of them, and this series arrangement is repeated N times to reach the desired number of memory elements in the array. The structures are joined in series at terminal regions, or junctures, 14 to one another and to the associated circuitry for these bit structures at the ends of the series strings. Word lines 19 are drawn over bit structures 10, which are represented as resistors to provide the schematic equivalent of the structure shown in FIG. 1.

The digital system using circuitry, the addressing circuitry, the decoding circuitry, and other control circuitry is represented in FIG. 4 as a box, 35. Thus, all of the control signals for operating the array shown in FIG. 4 emanate from box 35 in that figure. Positive voltage is supplied at a terminal, 36, and the ground reference voltage terminal is designated 37. Arbitrarily, the circuit of FIG. 4 is chosen to be the circuit for array 24 in FIG. 3 and so its information output voltage is supplied to a terminal designated 25. However, as indicated above, an identical circuit would be used in this example for array 27.

As indicated above, the magnetic state set in a bit resistor 10 as part of a writing operation has been chosen to be determined by the direction of the sense current flowing through that bit structure at a time when word current is flowing thereover. Therefore, the circuit of FIG. 4 must permit sense current to flow in either direction through bit structures 10. The amount of sense current permitted to flow is controlled primarily by an enhancement mode, silicon gate, p-channel, metal-oxide-semiconductor field-effect transistor (MOSFET), 38. The source of transistor 38 is electrically connected to terminal 36. Transistor 38 is operated at its gate by a bias generator which sets the current therethrough, this generator being located in control block 35 and providing its output at a control block output, 39.

The direction of current flow through bit structures 10 is controlled by a pair of inverters electrically connected between the drain of transistor 38 and ground terminal 32. The first inverter combination is comprised of a p-channel MOSFET, 40, similar to transistor 38, and an enhancement mode, silicon gate, n-channel MOSFET, 41. The second inverter combination is formed of a p-channel MOSFET, 42, and an n-channel MOSFET, 43. As can be seen, the circuit is a complementary MOSFET (CMOS) circuit. Each of these inverters is controlled by logic control signals provided by block 35, the signal for the first inverter provided at a block 35 output, 44, and the control signal for the second inverter provided at a block 35 output, 45.

The selection of a particular bit structure 10 for either writing or reading operations is determined by the series string of bit structures which is chosen to have a sense current provided therethrough and the one of that series string of bit structures which has word current flowing thereover. The selection of the series string, and of the word line, to coincidentally have currents flowing therein is controlled by the using circuits of the system providing addresses of the desired bit structure in block 35 and the decoding of those addresses in block 35. Block 35 outputs, 46, shown in two places along block 35 in FIG. 4, provide the decoded signals for bit structure string selection along signal lines going to gates of n-channel MOSFET transistors, 47, in series through its source and drain with each string of bit structures 10. Each transistor 47, if it receives a high state in the decode signal supplied to its gate, would permit current to flow in its associated bit structure string. For any given writing or reading operation, just one of outputs 46 will provide a signal on a gate of a transistor 47 so that just one of the bit structure strings will be permitted to have sense current therethrough. Transistors 47 are placed alternately at opposite ends of the strings as an aid in laying out the circuitry of FIG. 4 i an integrated circuit chip.

Note that each bit structure 10 string and its corresponding transistor 47 are connected in series between the outputs of the first inverter comprising transistors 40 and 41 and the second inverter comprising transistors 42 and 43. Thus, when a decode signal switches a transistor 47 into the "on" condition, the direction of current flow through the string and transistor 47 will be determined by the state of the first and second inverters which are always opposite one another. That is, if transistor 40 is in the "on" condition in the first inverter, then transistor 43 will be in the "on" condition in the second inverter with the other transistor in each of the converters in the "off" condition. In the opposite state, transistors 41 and 42 will be in the "on" condition and the other transistors in the two inverters will be in the "off" condition.

Assume that the farthest left string of bit structures 10 and its associated transistor 47 have been selected so that a decoding signal from block 35 output 46 is present at the gate of this leftmost transistor 47. If current is to flow in the direction so that it passes through the terminating regions or drain and source regions of transistor 47 and then into the string of bit structures 10, signals at block 35 outputs will be such that transistors 40 and 43 in the first and second inverters will be in the "on" condition with the other transistors in those inverters in the "off" condition. A reverse of the signal states on block 35 outputs 44 and 45 will lead to transistors 41 and 42 being in the "on" condition and the other transistors in these inverters in the "off" condition. This latter situation will result in current passing through the string of bit structures 10 and into the transistor 47 which is just in the opposite direction of the first direction of current flow. Hence, sense current can be caused to flow in either direction through bit structures 10 for purposes of setting a "0" or a "1" magnetization state therein by choosing the opposite states of these two inverters.

The choice of a particular bit structure 10 in the string thereof is determined by word line decode signals provided at one of a set of word line decoder outputs, 48, of block 35. Again, just one of these lines will have a signal on it in either a writing or a reading operation which will be provided to the corresponding gate of one of the word line control transistors, 49. The presence of a decode signal or not on one of outputs 48 is of course controlled by the using circuitry in block 35 having sent an address for a selected one of bit structures Further, as indicated above, word line currents operate in a pulse mode in either a reading or a writing operation. In a writing operation, the word line current will begin at approximately 10 milliAmps and will be pulsed up to around 30 milliAmps, as indicated above. In a reading operation, the word current again begins at approximately 10 milliAmps and then is pulsed to (i) a value less than the breakpoint word current value in FIG. 2B if the information stored in a bit structure 10 is not to be lost (could alternatively start at 0.0 milliAmps and go to 10.0 milliAmps), or (ii) to more or less the writing current value if the information stored in the bit structure 10 is to be permitted to be lost in an effort to obtain the maximum output signal from that bit structure 10. In the latter situation, a refresh circuit arrangement or procedure must be provided to again write into bit structure 10 that information that was lost after a reading.

In any event, a decode signal from the address circuitry 10 actually goes to current bias generators in block 35 which provide the proper voltages on the gates of transistors 49. These bias generators have their outputs as decode line outputs 48 of block 35. Current for the word lines 19 drawn through transistors 49 is supplied directly from positive supply terminal 36 to the drains of these transistors.

For a reading operation, voltage occurring across a bit structure 10 or, in this arrangement, across all of bit structures 10 in a series string thereof, must be communicated to the output of the array circuit here designated 25. Since the output occurs in the same bit structure string in which a sense current is flowing, the decoding signals from outputs 46 of block 35 which select the string in which sense current is to flow can also act to connect that string to output 25 through operating one of a set of n-channel MOSFET's, 50, serving as pass transistors. Thus, one pair of transistors 47 and 50 are switched into the "on" condition by a decode signal from a corresponding output 46 of block 35 applied to the gate of each. As a result, the voltage occurring across a string of bit structures 10 is provided through a transistor 50 from drain to source thereof to output 25 and on to input 21 of sense amplifier 10. The output voltage across the counterpart string of bit structures 10, in the circuit substantially identical to that of FIG. 4 that forms array 27, is also provided to sense amplifier 20 at input 22. In the absence of capacitors 26 and 29, amplifier 20 would, in effect, subtract the whole voltage supplied by array 24 from that of array 27 to leave the difference therebetween to be amplified as a signal.

Such a system can be operated on the basis of defining an information "1" for the system as having a bit resistor in array 24 in a "1" magnetization state with the counterpart bit resistor 10 in array 27 in the "0" magnetization state. An information "0" for the memory system as a whole would be defined as having a bit resistor in the array circuit 24 in the "0" magnetization state with the counterpart bit resistor in array 27 in the "1" magnetization state. Thus, the information output of array 24 is identical to the information output of the system, and the information output of array 27 is complementary to the information output of the system.

A reading operation then would have a sense current of 2.0 mA to 3.5 mA provided through the bit structure string which includes that bit structure 10 that is to provide its stored information. The sense current is to flow in the direction in which the "0" magnetization state would be written in that bit structure. The same sense current in the same direction for writing a "0" magnetization state is also provided in the counterpart bit structure string of array 27. The word line across that bit structure 10 which is to provide stored information in a circuit of array 24, and the word line across the counterpart bit structure in the circuit of array 27, are both switched to carry 10.0 mA initially. This current thereafter is increased to 30.0 mA and then back to 10.0 mA in a current pulse. This current level assumes that the "1" magnetization state occurring in one or the other of the selected bit structures in arrays 24 and 27 will be permitted to be switched to a "0" magnetization state to get the maximum output signal, a refresh writing to be provided thereafter.

In these circumstances, assuming a short across capacitances 26 and 29, the voltages across the two resistor strings, one of these being connected through a switch to each input of differential sensing amplifier 20, would in effect in amplifier 20 have one substracted from the other. The result would leave only the amplified difference between these two voltages plus uncompensated offsets appearing at the output of amplifier 20 which occurs because opposite ones of the two different magnetization states shown in FIGS. 2A and 2B are present on the selected bit structures in arrays 24 and 27. At the 10.0 mA word line level, this difference will be quite small, as indicated in FIG. 2B. If the word line currents in each of the circuits of arrays 24 and 27 are then pulsed up to 30.0 mA for around 10 ns and returned to 10.0 mA, that one of the information bit restructure and its counterpart reference bit restructure which was in the "1" magnetization state will thereafter be in the "0" magnetization state and have a lesser resistance. The remaining one of these structures that was initially in the "0" magnetization state will, of course, stay in the "0" magnetization state and have the same resistance it had.

Thus, the difference in voltage from the selected string of array 24 and the counterpart string of array 27 will change by an amount equal to the sense current times the change in resistance of that one of the information bit and the reference bit structures which went from the "1" magnetization state to the "0" magnetization state. If the information state of the memory for this particular pair of information and reference bit structures was in the "1" system information state defined above, the output change will be a positive voltage change. If, however, the information stored was in a "0" information state as defined above, the output change will be a negative voltage change because of the differential action of amplifier 20.

Operating, however in the absence of capacitors 26 and 29 leads to uncompensated offsets between series strings in arrays 24 and 27 being presented to amplifier 20. These offsets are relatively large because of the inability to identically match four information bit structures in a series string with four reference bit structures in a series string. The use of capacitors 26 and 29 in conjunction with switching circuitry in, and an amplification portion of, amplifier 20 permits these capacitors to be charged to a voltage to oppose the offsets. Such an arrangement gives a much better sensitivity for the very small signal changes provided by a selected information bit structure and its counterpart reference bit structure. This arrangement is shown in FIG. 5.

There is shown a mixed block and circuit schematic diagram for differential sensing amplifier 20 with capacitors 26 and 29 at inputs 21 and 22 of amplifier 20. Latching arrangement 30 at output 23 of amplifier 20 is shown as a D-type clocked flip-flop.

Amplifier 20 is formed of five differential output, differential input amplification stages, 51 through 55, connected to one another in cascade with the negative differential output of one connected to the positive differential input of the next and vice versa, although the outputs of stage 52 are so connected to the inputs of stage 53 through a pair of capacitors, 56 and 57. Similarly, the outputs of stage 53 are connected in the foregoing manner to the inputs of stage 54 through two further capacitors, 58 and 59. These gain stages are each operated with a gain of approximately 5.

Stage 51 has a switch, 60, connected from its negative marked output to its positive marked input, and has a further switch, 61, connected from its positive marked output to its negative marked input. Similarly, stage 53 has a switch, 62, connected from its negative marked output to its positive marked input, and has a further switch, 63, connected from its positive marked output to its negative marked input. This arrangement is repeated again about stage 54 which has a switch, 64, connected between its negative marked output and its positive marked input, and a further switch, 65, connected between its positive marked output and its negative marked input. These switches and the capacitors together permit reducing offsets to give a more sensitive sensing system for detecting the small signals available differentially between selected bit structure series strings in arrays 24 and 27.

Figure 6:
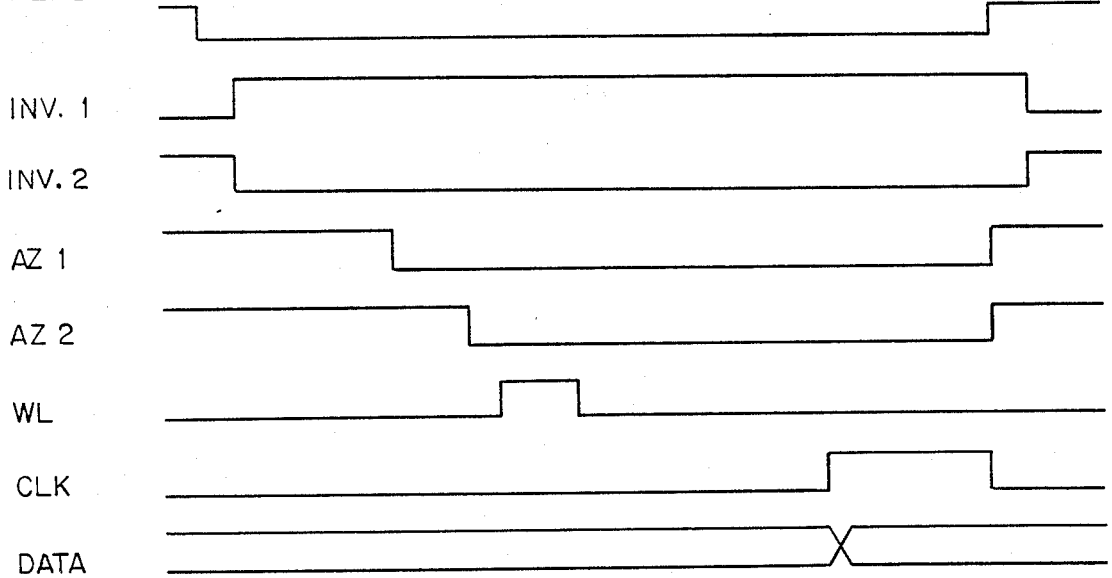
FIG. 6 waveforms encountered encountered in operating the system of FIG. 3.

FIG. 6 shows a set of waveforms which control, or occur during, a reading operation. A READ signal goes low in logic block 35 to indicate a read operation is to be performed. Shortly thereafter, the signals are provided to the sense current control transistor 38 at logic block output 39, and to each of the first and second inverters at logic block 35 outputs 44 and 45. The waveforms for the first and second inverters at outputs 44 and 45 are shown in FIG. 6, and similar but opposite-going waveforms are present, though not shown, for the first and second inverters in the circuit used in array 27.

The next waveforms control the charging of the various capacitors in FIG. 5 to remove offsets to provide a sensing system with sufficient sensitivity. These waveforms are the "autozero" waveforms $AZ_1$ and $AZ_2$. These two waveforms are initially in the high level voltage state causing the switches 60 through 65 to all be closed thereby connecting the stage outputs on one side of the switch to the stage inputs on the other. Though not shown, the decoding signals have also switched into the "on" condition the bit structure string selection transistors for the selected strings in arrays 24 and 27 to pass therethrough the corresponding sense currents, and have switched on the output connection transistor associated therewith. As a result, sense current is flowing in each selected string in array 24 and 27 and each such string is connected to its corresponding coupling capacitor to amplifier 20.

Because of the relatively high input impedance at the input to stage 51, the offsets present between the selected bit structure strings of arrays 24 and 27, and the offsets of amplifier 20 at the input of stage 51, will lead to voltages at the input of stage 51 reflecting the offsets. These offsets will drive input stage 51 to provide offsetting voltages at its outputs which will quickly charge capacitors 26 and 29 to those voltages which just counter the values of the offsets encountered at this input stage of amplifier 20. Thus, the countering voltages for the offsets are stored on capacitors 26 and 29 which capacitors would have as a typical capacitance value of 5 pf.

Concurrently, stage 53 also charges its capacitors in such a way as to reduce the offsets seen at its inputs which will be those offsets encountered at stage 51 and 52 multiplied by the gains between those stages and stage 53. Thus, the charging of capacitors 56 and 57 to counter these offsets by stage 53 assures that this stage will not be driven to one output limit or the other by the offsets occurring because of stages 51 and 52.

Autozero signal $AZ_1$ then goes to the low state while autozero signal $AZ_2$ remains in the high state. Thus, switches 60 through 63 open while switches 64 and 65 remain closed. The opening of switches 60 through 63 introduces both offset voltage and switch resetting noise into stage 51 which are error terms getting multiplied by the gain of stages 51, 52 and 53. These offsets present at the inputs of stage 54 are then countered by the outputs of stage 54 driving capacitors 58 and 59 to voltage levels sufficient to counter such offsets.

Thereafter, autozero signal $AZ_2$ goes to the low level state which injects offset and noise into stage 54. However, these errors are introduced to stage 54 after a gain of 125 has been applied to signals at the inputs of stage 51 so that the offsets and noise added at stage 54 remain relatively small compared to the input signals coming from the magnetoresistive memory at the inputs of stage 51.

After autozero signal $AZ_2$ goes to the low state, all is in readiness for applying a word line current pulse greater than 10 ns in duration to the information bit structure and to the reference bit structure together selected from arrays 24 and 27 for providing the information stored therein. The application of this word line current pulse leads to a differential voltage occurring between the strings containing these two bit structures. The voltage across each string is propagated through the switches 50 in the circuit of FIG. 4, and its counterpart in array 27, and through coupling capacitors 26 and 29 to inputs 21 and 22 of differential amplifier 20. An amplified version of the difference between these two voltages appears at output 23 of amplifier 20. D-type flip-flop 30 is provided a pulse in its CLOCK signal so that its state can be altered by the output signal appearing at amplifier output 23 if the signal is of appropriate polarity.

The portion of amplifier 20 past stage 55 comprises a differential input amplification stage, 66, which converts the differential signal presented thereto to an absolute signal referenced with respect to ground for driving the following inverter, 67. Inverter 67 provides some amplitude gain for this signal and drives a subsequent inverter, 68, which is used to provide an output pulse with a smooth, fast rise and fall times.

Differential sensing amplifier 20 also provides a filtering action to remove high frequency noise components from the signal presented thereto as well as being a sense amplifier to convert the analog voltage difference signal to a digital bit either "0" or "1". Such noise removal is necessary because of the very small amplitude of the voltage difference signal. Low frequency noise components are also removed by amplifier 20 in the offset removals achieved through the "autozero" procedure prior to pulsing the word line currents to a corresponding pair of bit structures to obtain the information content therein described above. The high frequeucy noise terms are removed by limiting the frequency noise bandwidth of the amplifier.

The bandwidth of the amplifier approximates the bandwidth response for a single pole network for the first freqence decade above the pole frequency. Such a single pole response is desirable because this gives the fastest amplifier response for a given noise bandwidth if there is a sufficiently large gain. The bandwidth of the sense amplifier should be set by a resistor constructed in the same manner as the bit structures so that it tracks the noise generated by such structures over temperature and over fabrication process differences arising in repeatedly fabricating monolithic integrated circuit chips containing these circuits. A pair of substantially equivalent resistors, 69 and 70, serve this purpose in the circuit of FIG. 5. Each is formed of the same ferromagnetic thin film as are bit structures 10.

Resistors 69 and 70 are each shown in series with a capacitor, 71 and 72, respectively, which are capacitors formed by two separated polycrystalline silicon layers in the monolithic integrated circuit chip. These capacitors are substantially the equivalent of one another. The two series arrangements of a resistor and a capacitor each form a feedback network about stage 54 which limits the bandwidth of amplifier 20.

As is well known, the noise in the differential signal obtained from the bit structures will have a noise density which is proporational to the square root of the resistance of those structures times the bandwidth of the system through which signals pass times the temperature of the structures. The bandwidth of amplifier 20 will be proportional to the reciprocal of the resistance value of either of resistors 69 or 70 times the capacitance value of either of capacitors 71 or 72. Thus, the high frequency noise will be proportional to the square root of the temperature divided by the capacitance value.

This is a very desirable result as the noise depends only then on the very well controlled capacitance values of capacitors 71 and 72 and temperature. This way of limiting the bandwidth of the signal provides an error rate which depends only on signal size, temperature and the value of a component type which is one of the most controllable values in the fabrication process, capacitance. The error rate is independent of the much more variable bit structure resistance.

In effect, should the process in which the magnetic bit structures are formed yield bit structures having higher resistance values so that the noise would increase, the system bandwidth will decrease. The result is that the error rate will remain approximately constant despite variations in the fabrication process for the bit structures. The clock signals and the operating signals developed in the memory system are based on the use of the same ferromagnetic thin film material for resistors used in the generating circuits of such signals to set the timing thereof so that the operating rate of the system also will slow if the bandwidth of the system is narrowed.

The gain stages of differential sensing amplifier 20 are conveniently formed of a pair of n-channel MOSFET's having the sources thereof connected together and to the drain of a further n-channel MOSFET serving as a current source. The bias generator for operating the n-channel MOSFET's serving as current sources in each of the gain stages has its bias output depend on a resistor formed of the same ferromagnetic thin film material as the bit structures to assure that the transconductance of each stage tracks the resistance value of the bit structure changes. The drain loads for the differentially connected MOSFET pair in each stage are provided by resistors made of the same ferromagnetic thin film material as are the bit structures. Thus, the gain of these gain stages can be accurately set despite variance in resistance values from one fabrication to the next. The switches about the stages in amplfier 20, operated by the "autozero" signals, are also n-channel MOSFET's.

Although the present invention has been described with reference to preferred embodiments, workers skilled in the art will recognize that changes may be made in form and detail without departing from the spirit and scope of the invention.

What is claimed is:

1. A state sensing circuit for sensing magnetic states of magnetic bit structures each comprising a memory film of a magnetoresistive, anisotropic, magnetic material between first and second terminal portions thereof, said circuit comprising:

a first pair of said bit structures having an identity bit structure and a complementary bit structure as members of said first pair of bit structures, there being a first identity transverse conductor located across an electrical insulating layer from said first pair identity bit structure;

a first identity series switching means having a pair of terminating regions, said first identity series switching means input being electrically connected at its said terminating regions in series between a first terminal means adapted for connection to a first source of current and said first pair identity bit structure at a said terminal portion thereof, said first identity series switching means being capable of selectively establishing a conductive path therethrough between said first identity series switching means pair of terminating regions to permit current to flow though said first pair identity bit structure;

a first complementary series switching means having a pair of terminating regions, said first complementary series switching means being electrically connected at its said terminating regions in series between a second source of current and said first pair complementary bit structure at a said terminal portion thereof, said first complementary series switching means being capable of selectively establishing a conductive path therethrough between said first complementary series switching means pair of terminating regions to permit current to flow through said first pair complementary bit structure;

a first identity transverse switching means having a pair of terminating regions, said first identity transverse switching means being electrically connected at its said terminating regions in series between a third terminal means adapted for connection to a third source of current and (with) said first identity transverse conductor, said first identity transverse switching means being capable of selectively establishing a conductive path therethrough between said first identity transverse switching means pair of terminating regions to permit current to flow through said first identity transverse conductor and past said first pair identity bit structure;

a first identity sense switching means having a pair of terminating regions with one of said first identity sense switching means pair of terminating regions being electrically connected to said first pair identity bit structure at a said terminal portion thereof, said first identity sense switching means being capable of selectively establishing a conductive path therethrough between said first identity sense switching means pair of terminating regions to permit signals to be transmitted occurring at said first pair identity bit structure upon said first identity series switching means and said first identity transverse switching means permitting current flow as aforesaid; and a sense amplified having an output region, a first input region which is capable of a relatively high circuit impedance and which is electrically connected to that one remaining of said first identity sense switching means pair of terminating regions, and a second input region which is capable of a relatively high circuit impedance and which is electrically connected to said first pair complementary bit structure, and said sense amplified being capable of providing at said sense amplified output region a signal substantially similar to a signal provided at said sense amplified first input region but in an opposite magnitude direction to provide a gain ratio therebetween, said sense amplified being capable of providing at its output region a signal substantially similar to a signal provided at said sense amplified second input region in an identical magnitude direction to provide a gain ratio there between to thereby provide a signal at its output region which represents that difference occurring between signals occurring at its first and second input regions.

2. The apparatus of claim 1 wherein said sense amplified second input region is electrically connected to said first pair complementary bit structure through a first complementary sense switching means having a pair of terminating regions with one of said first complementary sense switching means pair of terminating regions being electrically connected to said first pair complementary bit structure at a said terminal portion thereof, said first complementary sense switching means having that one of its said pair of terminating regions remaining electrically connected to said sense amplifier second input, said first complementary sense switching means being capable of selectively establishing a conductive path therethrough between said first complementary sense switching means pair of terminating regions.

3. The apparatus of claim 2 wherein said circuit further comprises:

a first complementary transverse conductor located across an electrical insulating layer from said first pair complementary bit structure; and a first complementary transverse switching means having a pair of terminating regions, said first complementary transverse switching means being electrically connected at its said terminating regions in series between a fourth terminal means adapted for connection to a fourth source of current and said first complementary transverse conductor, said first complementary transverse switching means being capable of selectively establishing a conductive path therethrough between said first complementary transverse switching means pair of terminating regions.

4. The apparatus of claim 3 wherein said circuit further comprises:

a second pair of said bit structures having an identity bit structure and a complementary bit structure as members of said second pair of bit structures, there being a second identity transverse conductor located across an electrical insulating layer from said second pair complementary bit structure, said second pair identity bit structure being electrically connected in series with said first pair identity bit structure and said firsts identity series switching means, said second pair complementary bit structure being electrically connected in series with said first pair complementary bit structure and said first complementary series switching means;

a second identity transverse switching means having a pair of terminating regions, said second identity transverse switching means being electrically connected at its said terminating regions in series between a fifth terminal means adapted for connection to a fifth source of current and (with) said second identity transverse conductor, said second identity transverse switching means being capable of selectively establishing a conductive path therethrough between said second identity transverse switching means pair of terminating regions; and a second complementary transverse switching means having a pair of terminating regions, said second complementary transverse switching means being electrically connected at its said terminating regions in series between a sixth terminal means adapted for connection to a sixth source of current and said second complementary transverse conductor, said second complementary transverse switching means being capable of selectively establishing a conductive path therethrough between said second complementary transverse switching means pair of terminating regions.

5. The apparatus of claim 4 wherein either of said first and second identity transverse switching means can establish a conductive path therethrough, as aforesaid, only if such a conductive path is absent in that one remaining, and either of said first an second complementary transverse switching means can establish a conductive path therethrough, as aforesaid, only if such a conductive path is absent in that one remaining.

6. The apparatus of claim 3 wherein said circuit further comprises:

a second pair of said bit structures having an identity bit structure and a complementary bit structure as members of said second pair of said bit structures, said first identity transverse conductor being located across an electrical insulating layer from said second pair identity bit structure and said first complementary transverse conductor being located across an electrical insulating layer from said second pair complementary bit structure;

a second identity series switching means having a pair of terminating regions, said second identity series switching means being electrically connected at its said terminating regions in series between a fifth terminal means adapted for connection to a fifth source of current and said second pair identity bit structure of a said terminal portion thereof, said second identity series switching means being capable of selectively establishing a conductive path therethrough between said second identity series switching means pair of terminating regions; and a second complementary series switching means having a pair of terminating regions, said second complementary series switching means being electrically connected at its said terminating regions in series between a sixth terminal means adapted for connection to a sixth source of current and said second pair complementary bit structure at a said terminal portion thereof, said second complementary series switching means being capable of selectively establishing a conductive path therethrough between said second complementary series switching means pair of terminating regions.

7. The apparatus of claim 6 wherein said circuit further comprises:

a second identity sense switching means having a pair of terminating regions with one of said second identity sense switching means pair of terminating regions being electrically connected to said second pair identity bit structure at a said terminal portion thereof and that one remaining being electrically connected to said sense amplifier first input region, said second identity sense switching means conductive path therethrough between said second identity sense switching means pair of terminating regions; and a second complementary sense switching means having a pair of terminating regions with one of said second complementary sense switching means pair of terminating regions being electrically connected to said second pair complementary bit structure at a said terminal portion thereof and that one remaining being electrically connected to said sense amplifier second input region, said second complementary sense switching means being capable of selectively establishing a conductive path therethrough between said second complementary sense switching means pair of terminating regions.

8. The apparatus of claim 6 wherein either of said first and second identity series switching means can establish a conductive path therethrough, as aforesaid, only if such a conductive path is absent in that one remaining, and either of said first and second complementary series switching means can establish a conductive path therethrough, as aforesaid, only if such a conductive path is absent in the one remaining.

9. The apparatus of claim 8 wherein said first, second, fifth and sixth current sources are capable of causing currents to flow in either direction through said first pair identity bit structure said first pair complementary bit structure, said second pair identity bit structure, and said second pair complementary bit structure, respectively.

10. The apparatus of claim 8 wherein said sense amplifier first input region is electrically connected through a first coupling capacitor to a said terminating region of each of said first and second identity sense switching means, and wherein said sense amplifier second input region is electrically connected through a second coupling capacitor to a said terminating region of each of said first and second complementary sense switching means.

11. The apparatus of claim 10 wherein first and second terminating regions in said sense amplifier can be selectively electrically connected to said sense amplifier first and second input regions, respectively, to permit charging at least one of said first and second coupling capacitors to a value equivalent of any accumulated offset voltages occurring at said sense amplifier first and second input regions.

12. The apparatus of claim 11 wherein said sense amplifier has a bandwidth which varies with electrical resistances of said first pair members.

13. The apparatus of claim 3 wherein said circuit further comprises a threshold device having an input and an output with said threshold device input being electrically connected to said sense amplifier output region, said threshold device providing signals at said threshold device output which depend on whether signals which have occurred at said threshold device input have exceeded a first threshold value.

14. The apparatus of claim 3 wherein said sense amplifier first input region is electrically connected to one of said first identity sense switching means pair of terminating regions through a first coupling capacitor, and wherein said sense amplifier second input region is electrically connected to one of said first complementary sense switching means pair of terminating regions through a second coupling capacitor.

15. The apparatus of claim 14 wherein first and second terminating regions in said sense amplifier can be selectively electrically connected to said sense amplifier first and second input regions, respectively, to permit charging at least one of said first and second coupling capacitors to a value equivalent of any accumulated offset voltages occurring at said sense amplifier first and second input regions.

16. The apparatus of claim 15 wherein said sense amplifier has a bandwidth which varies with electrical resistances of said first pair members.

17. The apparatus of claim 1 wherein said sense amplifier has a bandwidth which varies with electrical resistances of said first pair members.

18. The apparatus of claim 1 wherein said circuit further comprises:

a first complementary transverse conductor located across an electrical insulating layer from said first pair complementary bit structure; and a first complementary transverse switching means having a pair of terminating regions, said first complementary transverse switching means being electrically connected at its said terminating regions in series between a fourth terminal means adapted for connection to a fourth source of current and said first complementary transverse conductor, said first complementary transverse switching means being capable of selectively establishing a conductive path therethrough between said first complementary transverse switching means pair of terminating regions.

19. The apparatus of claim 1 wherein said circuit further comprises a threshold device having an input and an output with said threshold device input being electrically connected to said sense amplifier output region, said threshold device providing signals at said threshold device output which depend on whether signals which have occurred at said threshold device input have exceeded a first threshold value.

20. The apparatus of claim 1 wherein said sense amplifier first input region is electrically connected to one of said first identity sense switching means pair of terminating regions through a first coupling capacitor, and wherein said sense amplifier second input region is electrically connected to said first pair complementary bit structure through a second coupling capacitor.

21. The apparatus of claim 20 wherein said sense amplifier has a bandwidth which varies with electrical resistances of said first pair members.

22. The apparatus of claim 20 wherein first and second terminating regions in said sense amplifier can be selectively electrically connected to said sense amplifier first and second input regions, respectively, to permit charging at least one of said first and second coupling capacitors to a value equivalent of any accumulated offset voltages occurring at said sense amplifier first and second input regions.

23. The apparatus of claim 22 wherein said sense amplifier has a bandwidth which varies with electrical resistances of said first pair members.

* * * * *

UNITED STATES PATENT AND TRADEMARK OFFICE
CERTIFICATE OF CORRECTION

PATENT NO. : 4,829,476
DATED : May 9, 1989
INVENTOR(S) : Tim J. Dupuis et al.

It is certified that error appears in the above-identified patent and that said Letters Patent is hereby corrected as shown below:

Column 14, line 65, delete "(with)".

Column 15, line 19, 27, 28, 30, 32, 35, and 41-42, delete "amplified", insert "amplifier".

Column 16, line 12, after "second pair", insert "identity bit structure and there being a second complementary transverse conductor located across an electrical insulating layer from said second pair".

Column 16, line 15, delete "firsts", insert "first".

Column 16, line 25, delete "(with)".

Column 16, line 47, delete "an", insert "and".

Column 17, line 26, after "switching means", insert "being capable of selectively establishing a"

Column 17, line 49, delete "the", insert "that".

Column 17, line 53, after "structure", insert ",".

Signed and Sealed this

Twenty-eighth Day of November 1989

Attest:

JEFFREY M. SAMUELS

*Attesting Officer*        *Acting Commissioner of Patents and Trademarks*